(12) United States Patent
Okamoto

(10) Patent No.: US 7,432,211 B2
(45) Date of Patent: Oct. 7, 2008

(54) METHOD FOR MANUFACTURING SEMICONDUCTOR DEVICE

(75) Inventor: Satoru Okamoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 152 days.

(21) Appl. No.: 11/099,628

(22) Filed: Apr. 6, 2005

(65) Prior Publication Data

US 2005/0241952 A1 Nov. 3, 2005

(30) Foreign Application Priority Data

Apr. 28, 2004 (JP) .............................. 2004-132677

(51) Int. Cl.
*H01L 21/302* (2006.01)
(52) U.S. Cl. .................. 438/725; 438/745; 438/754
(58) Field of Classification Search ............... 438/689, 438/706, 710, 714, 720, 725, 745, 746, 754; 134/1.1, 1.2, 1.3; 510/175, 176
See application file for complete search history.

(56) References Cited

U.S. PATENT DOCUMENTS

| | | | | |
|---|---|---|---|---|
| 5,298,112 | A | * | 3/1994 | Hayasaka et al. .......... 216/67 |
| 5,387,556 | A | | 2/1995 | Xiaobing et al. |
| 5,533,540 | A | * | 7/1996 | Stanasolovich et al. .... 134/155 |
| 6,004,839 | A | | 12/1999 | Hayashi et al. |
| 6,033,993 | A | * | 3/2000 | Love et al. .................. 438/745 |
| 6,077,450 | A | | 6/2000 | Lee |
| 6,093,457 | A | | 7/2000 | Okumura et al. |
| 6,136,515 | A | * | 10/2000 | Chen .......................... 430/330 |
| 6,348,405 | B1 | | 2/2002 | Ohuchi |
| 6,350,391 | B1 | * | 2/2002 | Livshits et al. ............... 216/65 |
| 6,475,966 | B1 | | 11/2002 | Sahbari |
| 6,514,774 | B1 | | 2/2003 | Foley |
| 6,753,257 | B2 | | 6/2004 | Yamazaki |
| 6,930,047 | B2 | | 8/2005 | Yamazaki et al. |
| 7,015,080 | B2 | | 3/2006 | Ishikawa |
| 7,015,141 | B2 | | 3/2006 | Yamazaki |

(Continued)

FOREIGN PATENT DOCUMENTS

JP  06-005563  1/1994

(Continued)

OTHER PUBLICATIONS

V. Premachandran, "Etch Rate Enhancement of Photoresist in Nitrogen-Containing Plasmas", Appl. Phys. Lett., vol. 55, No. 24, pp. 2488-2490, Dec. 11, 1989.

(Continued)

*Primary Examiner*—Kin-Chan Chen
(74) *Attorney, Agent, or Firm*—Nixon Peabody LLP; Jeffrey L. Costellia

(57) ABSTRACT

It is an object of the present invention to a method for manufacturing a semiconductor device, by which a reaction product formed when a conductive layer is etched can be removed. A method for manufacturing a semiconductor device according to the present invention includes a step of felling a reaction product adhering to a conductive layer so as to extend in a perpendicular direction so that the thickness of the reaction product with respect to a direction in which an active species excited by plasma discharge is accelerated. It is to be noted that the reaction product is produced when the conductive layer is etched.

39 Claims, 8 Drawing Sheets

U.S. PATENT DOCUMENTS

| | | | |
|---|---|---|---|
| 2004/0063256 A1* | 4/2004 | Ishikawa | 438/149 |
| 2004/0087457 A1* | 5/2004 | Korzenski et al. | 510/177 |
| 2005/0090113 A1* | 4/2005 | Chang | 438/704 |
| 2005/0181610 A1 | 8/2005 | Sasagawa et al. | |
| 2005/0266593 A1 | 12/2005 | Suzawa et al. | |
| 2006/0040840 A1* | 2/2006 | Korzenski et al. | 510/175 |
| 2006/0128080 A1 | 6/2006 | Ishikawa | |

FOREIGN PATENT DOCUMENTS

| | | |
|---|---|---|
| JP | 09-213703 | 8/1997 |
| JP | 09-279367 | 10/1997 |

OTHER PUBLICATIONS

Shuzo Fujimura, et al. "Addictive Nitrogen Effects on Oxygen Plasma Downstream Ashing", Japanese Journal of Applied Physics, vol. 29, No. 10, pp. 2165-2170, 1990.

* cited by examiner 801a 802a 801b 802b

METHOD FOR MANUFACTURING SEMICONDUCTOR DEVICE

BACKGROUND OF THE INVENTION

1. Field of the Invention

The present invention relates to a method for manufacturing a semiconductor device, and particularly relates to a method for forming a conductive layer.

2. Description of the Related Art

In manufacture of a semiconductor device, after forming a conductive layer, a wiring in a desired shape is formed by etching the conductive layer with a resist as a mask.

For etching a conductive layer, dry etching is often used. Dry etching is a method in which an active species excited by plasma discharge is pulled toward an object to be processed by applying a bias, and the active species is reacted with the object to be processed to etch the object to be processed. When such dry etching is used to etch a conductive layer, a reaction product is formed by a reaction of an active species with the conductive layer. Although most of the reaction product is evacuated during etching, a portion thereof adheres to a resist used as a mask. Then, most of the reaction product adhering to the resist is usually removed when the resist used as a mask is removed. However, a portion of the reaction product remains adhering to the conductive layer and standing in a perpendicular direction. The thus reaction product remaining on the conductive layer may cause defects of a semiconductor device. Therefore, it is necessary to remove the reaction product. However, it is difficult to remove the reaction product adhering to the conductive layer and standing in a perpendicular direction by highly anisotropic etching such as dry etching.

In order to solve the problem described above, for example, in Patent Document 1, a method for manufacturing a semiconductor device is disclosed in which a reaction product is removed by using a hydrofluoric acid vapor treatment.

However, in order to remove a reaction product by the method as in Patent Document 1, it is necessary to provide a new apparatus for hydrofluoric acid vapor treatment so that the cost of manufacturing equipment is increased. Therefore, development of a method for manufacturing a semiconductor device is required in order to remove a reaction product more easily.

(Patent Document 1) Japanese Patent Application Laid-Open No. 9-213703

SUMMARY OF THE INVENTION

It is an object of the present invention to a method for manufacturing a semiconductor device, by which a reaction product formed when a conductive layer is etched can be removed.

A method for manufacturing a semiconductor device according to the present invention includes a step of felling a reaction product adhering to a conductive layer so as to extend in a perpendicular direction so that the thickness of the reaction product with respect to a direction in which an active species excited by plasma discharge is accelerated becomes thin.

In a method for manufacturing a semiconductor device according to the present invention, after felling, in a horizontal direction or an oblique direction, a reaction product adhering to a conductive layer so as to extend in a perpendicular direction, this reaction product is etched.

It is to be noted that the reaction product is produced when the conductive layer is etched. In addition, the perpendicular direction, the horizontal direction, and the oblique direction respectively indicate a perpendicular direction, horizontal direction, and oblique direction with respect to the surface of a substrate.

A method for manufacturing a semiconductor device according to the present invention includes a step of etching a conductive layer with a shaped mask on the surface thereof while producing a reaction product adhering to a side wall of the conductive layer, a step of processing with the use of a liquid composition in which the mask is dissolved selectively after etching to remove the mask and fell, in a horizontal direction or oblique direction with respect to a substrate, the reaction product adhering to the conductive layer so as to extend in a perpendicular direction, and a step of etching the reaction product with the use of a mixed gas of oxygen gas and halide gas after processing with the use of the liquid composition.

The present invention makes it possible to prevent defects due to a reaction product generated in etching for forming a conductive layer from occurring and to obtain a semiconductor device that operates well.

DETAILED DESCRIPTION OF THE INVENTION

Figure 1A:
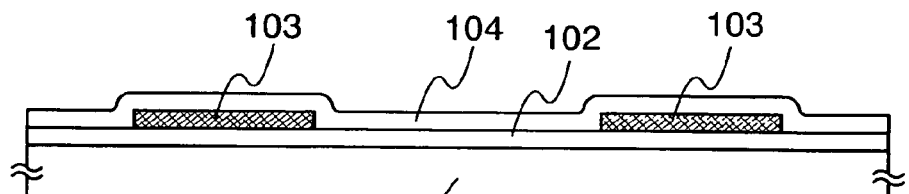
FIGS. 1A to 1G are diagrams illustrating a method for manufacturing a semiconductor device according to the present invention.
Figure 1B:
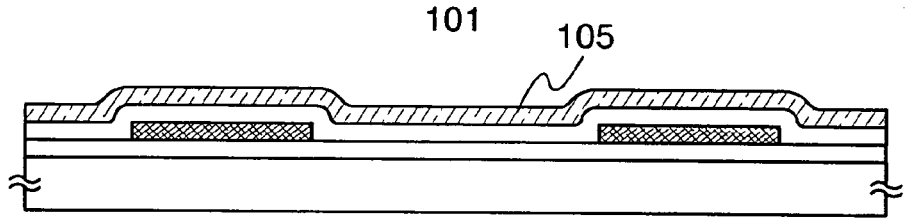
Figure 1C:
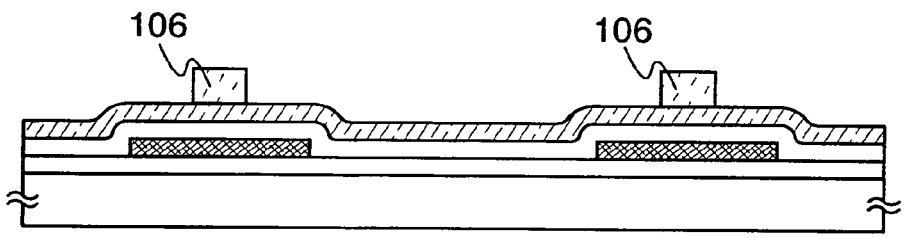
Figure 1D:
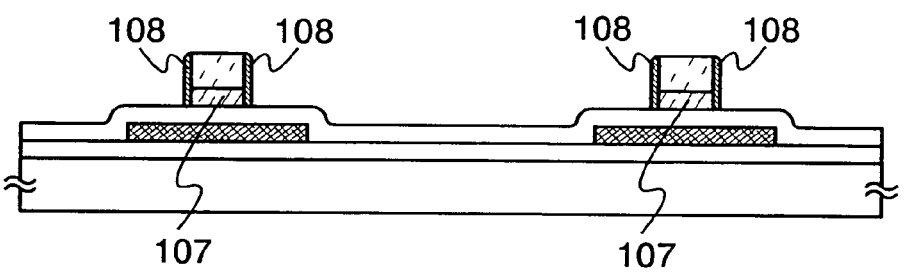
Figure 1E:
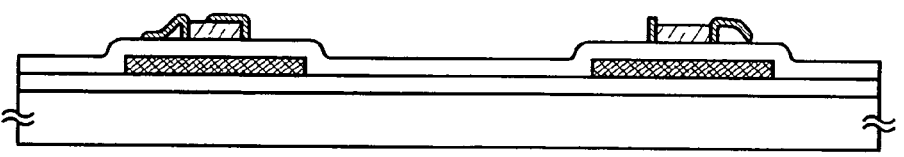
Figure 1F:
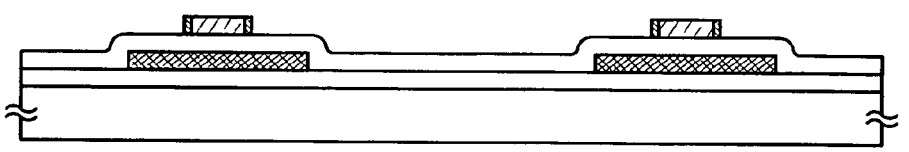
Figure 1G:
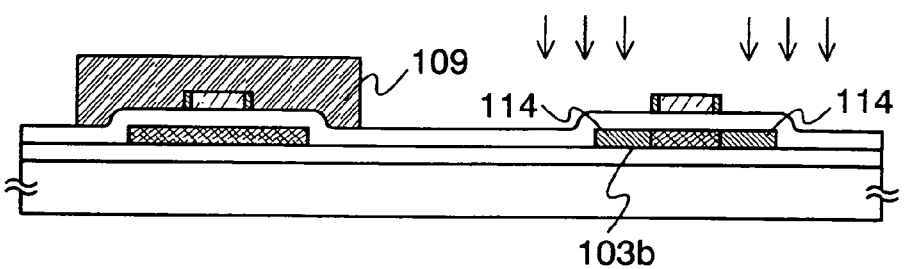
Figure 2A:
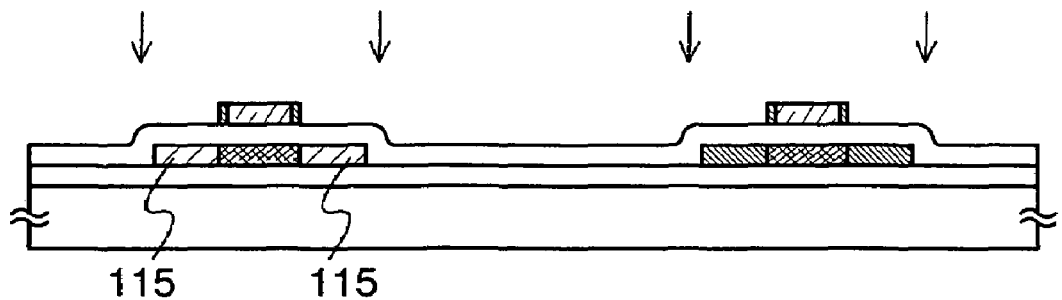
FIGS. 2A to 2D are diagrams illustrating the method for manufacturing a semiconductor device according to the present invention.
Figure 2B:
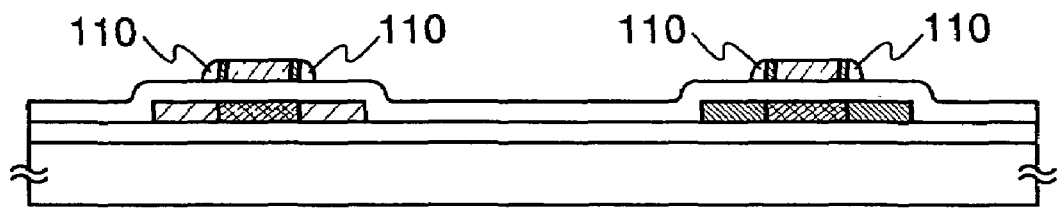
Figure 2C:
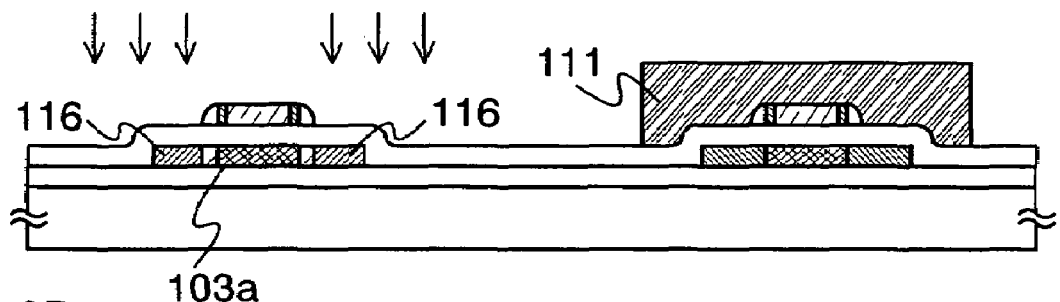
Figure 2D:
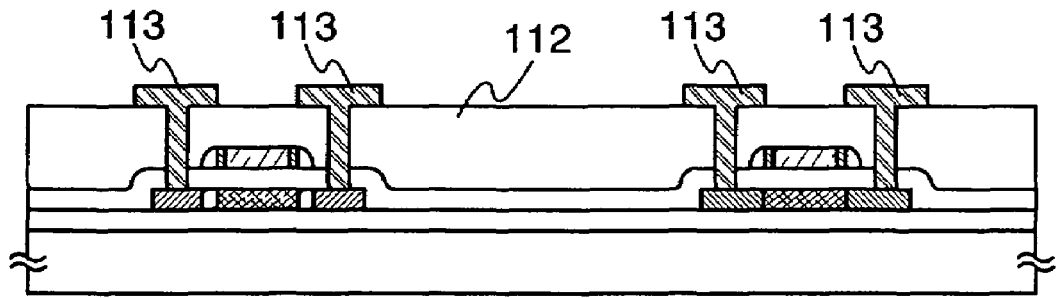
Figure 3A:
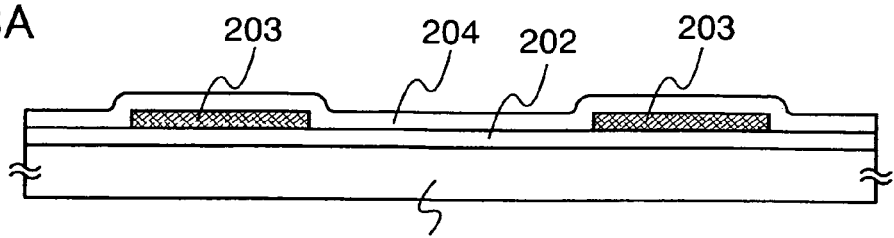
FIGS. 3A to 3G are diagrams illustrating a method for manufacturing a semiconductor device according to the present invention.
Figure 3B:
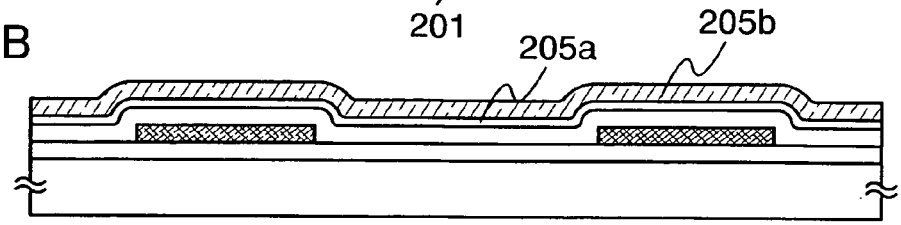
Figure 3C:
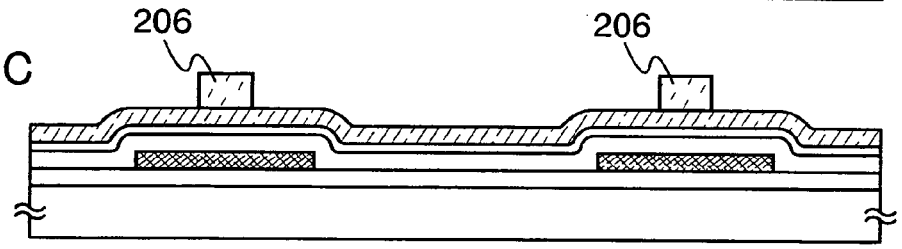
Figure 3D:
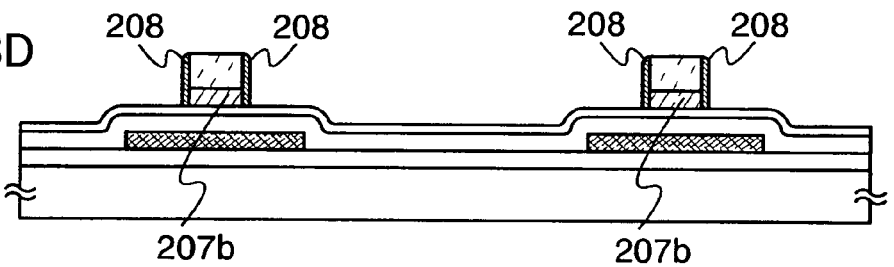
Figure 3E:
Figure 3F:
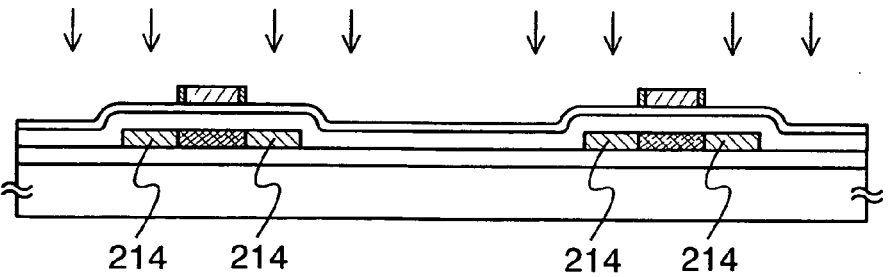
Figure 3G:
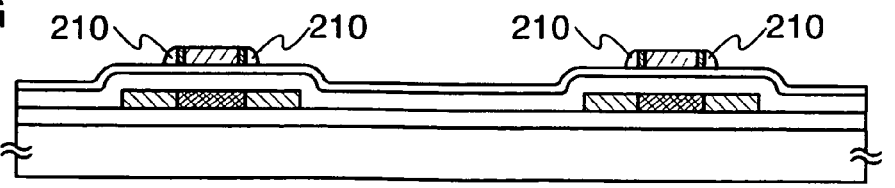
Figure 4A:
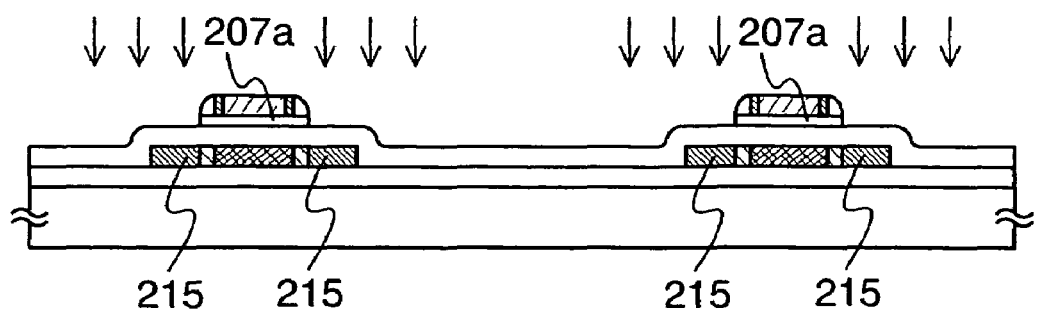
FIGS. 4A and 4B are diagrams illustrating the method for manufacturing a semiconductor device according to the present invention.
Figure 4B:
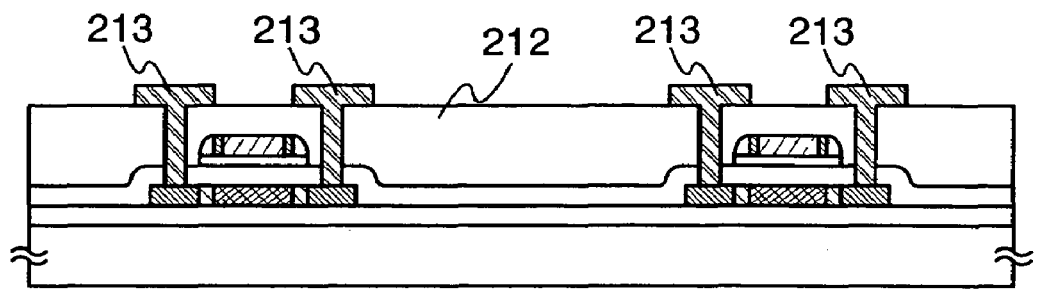

Embodiment Modes of the present invention will be described below. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiments.

(Embodiment Mode 1)

A method for manufacturing a semiconductor device according to the present invention will be described with reference to FIGS. 1A to 1G and FIGS. 2A to 2D.

First an insulating layer 102 is formed on a substrate 101. Here, the substrate 101 is not particularly limited, and a flexible substrate including plastics or the like as a material can be used in addition to a substrate including glass or quartz as a material. In addition, the insulating layer 102 is not particularly limited either, and can be formed with the use of silicon oxide, silicon nitride including oxygen, or the like.

Next, after forming an amorphous semiconductor layer on the insulating layer 102, the amorphous semiconductor layer is crystallized by laser light irradiation, RTA (Rapid Thermal Annealing), a heat treatment using a furnace, or the like, and processed into a desired shape to form a semiconductor layer 103. Here, the forming method of the semiconductor layer 103 is not particularly limited, a method of processing a crystalline semiconductor layer formed by CVD under a high-temperature condition into a desired shape may be employed in addition to the methods described above.

Further, the semiconductor layer 103 or the amorphous or crystalline semiconductor layer before processing into a desired shape may be doped with an impurity for controlling the threshold voltage of a transistor. In this case, the impurity for doping may be an n-type impurity such as phosphorus or arsenic or a p-type impurity such as boron.

Next, an insulating layer 104 is formed to cover the semiconductor layer 103. The insulating layer 104 is not particularly limited, and can be formed with the use of silicon oxide, silicon nitride, silicon nitride including oxygen, or the like. In addition, the forming method thereof is not particularly limited either, and the insulating layer 104 can be formed by CVD, sputtering, or the like. Furthermore, the insulating layer 104 may be any one of a single layer and a multilayer.

Next, a conductive layer 105 is formed on the insulating layer 104. The conductive layer 105 is not particularly limited, and tungsten, molybdenum, aluminum, tungsten nitride, tantalum nitride, and the like can be used to form the conductive layer 105. Further, the conductive layer 105 may be any one of a single layer and a multilayer.

Next, after forming a photosensitive resin on the conductive layer 105, the photosensitive resin is processed into a desired shape by photolithography to form a mask 106 composed of the photosensitive resin. Here, the photosensitive resin is not particularly limited, and resist, photosensitive acrylic, or the like can be used. Although the light source for photolithography is not particularly limited, it is preferable to use light with a short wavelength such as i-line as the light source when a microscopic transistor that has a short channel length is manufactured.

Next, the conductive layer 105 is selectively etched. It is preferable to use highly anisotropic dry etching for etching. The method for dry etching is not particularly limited, and capacitively coupled plasma (CCP), electron cyclotron resonance (ECR), reactive ion etching (RIE), and the like can be used in addition to inductively coupled plasma (ICP). It is to be noted that a method such as ICP, CCP, or ECR by which high-density plasma can be generated is preferable when processing into a microscopic shape is desired. In addition, in order for a reaction product generated during etching to adhere to a side wall of a conductive layer 107 remaining after etching, it is preferable to perform etching by appropriately selecting the temperature of an electrode on which the substrate 101 is located, the supply of a process gas, and the pressure. This makes it possible to prevent the side wall of the conductive layer 107 from being etched into a concaved shape. Namely, a reaction product 108 adhering to the side wall of the conductive layer 107 serves as a protective film for the conductive layer 107. Further, it is preferable that the film thickness of the reaction product 108 (the thickness in a direction perpendicular to the surface of the substrate 101) be controlled to be 0.1 to 10 nm, more preferably 1 to 5 nm. This makes the reaction product 108 easily fall down when the mask 106 is removed, and makes it possible to protect the conductive layer 107. It is to be noted that the reaction product 108 adheres to the mask 106 composed of the photosensitive resin.

Next, the substrate 101 after forming the conductive layer 107 is processed with the use of a liquid composition in which the photosensitive resin can be dissolved selectively so that the mask 106 is removed. It is to be noted that he liquid composition is not particularly limited, and a stripping solution and the like can be used. This process removes the mask 106. In addition, by the treatment with the liquid composition and a subsequent washing treatment, the reaction product 108 remaining while adhering to the conductive layer 107 falls down on the conductive layer 107 or the insulating layer 104 in a horizontal direction or an oblique direction. Further, after the washing treatment, a treatment with a solution such as water may be performed while applying sound wave energy such as ultrasonic waves (10 to 100 kHz) or megasonic waves (0.7 to 1.0 MHz). This makes the reaction product 108 more easily fall down. In addition, when the surface of the mask 106 composed of the photosensitive resin is all covered with the reaction product 108 so that it is difficult for the liquid composition to come in contact with the photosensitive resin, the photosensitive resin may be removed with the use of the liquid composition after ashing or the like.

Next, a mixed gas of oxygen gas and halide gas is used as a process gas to etch the reaction product 108. Here, it is preferable to use highly anisotropic dry etching for etching. The method for dry etching is not particularly limited, and capacitively coupled plasma (CCP), electron cyclotron resonance (ECR), reactive ion etching (RIE), and the like can be used in addition to inductively coupled plasma (ICP). The halide gas is not particularly limited, and a carbon tetrafluoride gas, chlorine gas, and the like can be used. The reaction product 108 lying on the conductive layer 107 or the insulating layer 104 is easily etched since the thickness of the reaction product 108 is thin with respect to a direction in which an accelerated active species travels. It is to be noted that a portion of the reaction product 108 adhering to the side wall of the conductive layer 107 may be left without being etched since the portion is thick with respect to the direction in which the accelerated active species travels. However, since the reaction product 108 including a metal element is conductive, the portion can be used as a gate electrode of a transistor or the like together with the conductive layer 107.

Next, a portion in which an n-channel transistor is to be formed is covered with a mask 109 composed of a photosensitive resin or the like, and the semiconductor layer 103 to serve as an active layer of a p-channel transistor is selectively doped with a high concentration of p-type impurity to form a semiconductor layer 103b including a high-concentration p-type impurity region 114. Here, the p-type impurity is not particularly limited, and boron and the like can be used. It is to be noted that since the conductive layer 107 (including the reaction product 108 adhering to the side wall of the conductive layer 107) is also used as a mask, a portion of the semiconductor layer 103b, covered with the conductive layer 107, is not doped with the impurity. By this doping, an impurity region to serve as a source or drain of a p-channel transistor can be formed. Further, after doping, the mask 109 is removed.

Next, with the use of the conductive layer 107 as a mask, the semiconductor layer 103 is doped with a lower concentration of n-type impurity to form a lower-concentration n-type impurity region 115. Here, the n-type impurity is not particularly limited, and phosphorus, arsenic, and the like can be used.

Next, after forming an insulating layer covering the conductive layer 107 and the like, this insulating layer is processed by anisotropic etching to form a sidewall 110 on a side wall of the conductive layer 107 in a self-alignment manner. Here, the insulating layer is not particularly limited. However, it is preferable that the insulating layer include silicon oxide formed to have a favorable step coverage by reacting TEOS (Tetra-Ethyl-Orso-Silicate), silane, or the like with oxygen, nitrous oxide, or the like.

Next, a portion in which the p-channel transistor is formed is covered with a mask 111 composed of a photosensitive resin or the like, and the semiconductor layer 103 to serve as an active layer of an n-channel transistor is selectively doped with a higher concentration of n-type impurity to form a semiconductor layer 103a including a higher-concentration n-type impurity region 116. Here, the n-type impurity is not particularly limited, and phosphorus, arsenic, and the like can be used. It is to be noted that since the conductive layer 107 (including the reaction product 108 adhering to the side wall of the conductive layer 107) is also used as a mask, a portion of the semiconductor layer 103a, covered with the conductive layer 107, is not doped with the impurity. By this doping, an impurity region to serve as a source or drain of an n-channel transistor can be formed. Further, after doping, the mask 111 is removed.

As described above, the n-channel transistor including the semiconductor layer 103a, the insulating layer 104, and the conductive layer 107 and the p-channel transistor including the semiconductor layer 103b, the insulating layer 104, and the conductive layer 107 can be manufactured. It is to be noted that the structures of the transistors are not particularly limited although the n-channel transistor is an LDD type transistor including a lower-concentration impurity region and the p-channel transistor a single drain type transistor in the present embodiment mode. Therefore, the n-channel transistor and the p-channel transistor may have different structures respectively or have the same structure. In addition, it is not always necessary that the n-channel transistor or the p-channel transistor be an LDD type transistor formed by using a sidewall.

Next, an insulating layer 112 is formed to cover the conductive layer 107 and the like. The insulating layer 112 serves as an interlayer insulating layer. The insulating layer 112 is not particularly limited, and in addition to inorganic materials such as silicon oxide, silicon nitride, and silicon nitride including oxygen, organic materials such as acrylic and polyimide can be used to form the insulating layer 112. In addition, the insulating layer 112 may be any one of a single layer and a multilayer. Further, before or after forming the insulating layer 112, a heat treatment or hydrogen treatment for activating the impurities added in the foregoing processes may be performed appropriately. Further, when the insulating layer 112 is formed of a multilayer, a heat treatment may be performed between forming a certain layer and forming another layer to be stacked on the certain layer.

Next, a contact hole is formed to reach each of the semiconductor layers 103a and 103b through the insulating layer 112. Then, after forming a conductive layer to cover the insulating layer 112 with the contact holes, the conductive layer is processed in a desired shape to form a wiring 113 for transmitting a signal to a transistor.

It is to be noted that a semiconductor device including a multilayer wiring may be manufactured by providing an insulating film on the wiring 113 and further forming another wiring on the insulating layer.

By manufacturing a semiconductor device as described above, defects due to a reaction product generated in etching for forming a conductive layer can be prevented from occurring, and a semiconductor device that operates well can be obtained. In addition, it is not necessary to prepare any new apparatus, and the method for manufacturing a semiconductor device according to the present invention can be implemented with the use of existing apparatuses.

(Embodiment Mode 2)

A method for manufacturing a semiconductor device according to the present invention will be described with reference to FIGS. 3A to 3G and FIGS. 4A and 4B.

First, after forming an insulating layer 202 on a substrate 201, a semiconductor layer 203 is formed on the insulating layer 202. Further, an insulating layer 204 is formed to cover the semiconductor layer 203. It is to be noted that the substrate 201, the insulating layer 202, the semiconductor layer 203, and the insulating layer 204 may be formed in the same ways respectively as the substrate 101, the insulating layer 102, the semiconductor layer 103, and the insulating layer 104 described in Embodiment Mode 1.

Next, a conductive layer 205a is formed on the insulating layer 204, and a conductive layer 205b is further formed on the conductive layer 205b. Although the conductive layer 205a is not particularly limited, it is preferable that the thickness of the conductive layer 205a be controlled so as to perform doping through the conductive layer 205a. Further, it is preferable that the conductive layer 205a have favorable adhesiveness with the insulating layer 204. Specifically, tantalum nitride, titanium nitride, or tungsten nitride, or the like deposited to be 10 to 30 nm in thickness can be used. In addition, although the conductive layer 205b is not particularly limited either, it is preferable that the conductive layer 205b be formed with the use of a material that is lower in resistance, such as aluminum, tungsten, or molybdenum.

Next, after forming a photosensitive resin on the conductive layer 205b, the photosensitive resin is processed into a desired shape by photolithography to form a mask 206 composed of the photosensitive resin.

Next, the conductive layer 205b is selectively etched to form a conductive layer 207b processed into a desired shape. It is preferable to use highly anisotropic dry etching for etching. The method for dry etching is not particularly limited, and capacitively coupled plasma (CCP), electron cyclotron resonance (ECR), reactive ion etching (RIE), and the like can be used in addition to inductively coupled plasma (ICP). It is to be noted that a method such as ICP, CCP, or ECR by which high-density plasma can be generated is preferable when processing into a microscopic shape is desired. In addition, etching of the conductive layer 205b may be performed in the same manner as the etching of the conductive layer 105 in Embodiment Mode 1. Also in the present embodiment mode, a reaction product 208 is made to adhere to a side wall of the conductive layer 207b in the same way as in Embodiment Mode 1. This makes it possible to prevent a side wall of the conductive layer 207b from being etched into a concaved shape. Further, the reaction product 208 adheres also to the mask 206 as in the case of the mask 106.

Next, the substrate 201 after forming the conductive layer 207b processed into the desired shape is processed with the use of a liquid composition in which the photosensitive resin can be dissolved selectively so that the mask 206 composed of the photo sensitive resin is removed. It is to be noted that the process for removing the mask 206 may be performed in the same way as the removal of the mask 106 described in Embodiment Mode 1. By the treatment with liquid composition and a subsequent washing treatment, the reaction product 208 remaining while adhering to the conductive layer 207b falls down on the conductive layer 207b or the insulating layer 204 in a horizontal direction or an oblique direction. Further, after the washing treatment, a treatment with a solution such as water may be performed while applying sound wave energy such as ultrasonic waves (10 to 100 kHz) or megasonic waves (0.7 to 1.0 MHz). This makes the reaction product 208 more easily fall down.

Next, a mixed gas of an oxygen gas and a halide gas is used as a process gas to etch the reaction product 208. It is preferable to use highly anisotropic dry etching for etching. The method for dry etching is not particularly limited, and capacitively coupled plasma (CCP), electron cyclotron resonance (ECR), reactive ion etching (RIE), and the like can be used in addition to inductively coupled plasma (ICP). In addition, this process may be performed in the same manner as the process of etching the reaction product 108 described above. Also in this process, the halide gas is not particularly limited, and a carbon tetrafluoride gas, chlorine gas, and the like can be used. However, it is preferable to use a gas by which the conductive layer 205a is not easily etched. The reaction product 208 lying on the conductive layer 207b or the insulating layer 204 is easily etched since the thickness of the reaction product 208 is thin with respect to a direction in which an accelerated active species travels.

Next, with the use of the conductive layer 207b as a mask, the semiconductor layer 203 is doped with a lower concentration of n-type impurity. As the n-type impurity, phosphorus, arsenic, and the like can be used. The semiconductor layer 203 is doped with the impurity through the conductive layer 205a and the insulating layer 204, and a lower-concentration impurity region 214 is thus formed in the semiconductor layer 203.

Next, after forming an insulating layer covering the conductive layers 205a and 207b and the like, this insulating layer is processed by anisotropic etching to form a sidewall 210 on a side wall of the conductive layer 207b in a self-alignment manner. Here, the insulating layer is not particularly limited. However, it is preferable that the insulating layer include silicon oxide formed to have a favorable step coverage by reacting TEOS (Tetra-Ethyl-Orso-Silicate), silane, or the like with oxygen, nitrous oxide, or the like.

Next, with the use of the conductive layer 207b and the sidewall 210 as a mask, the conductive layer 205a is selectively etched to form a conductive layer 207a. By this process, a gate electrode composed of the stacked conductive layers 207a and 207b can be formed. It is to be noted that the surface area of the conductive layer 207a is larger than the surface area of the conductive layer 207b and the stacked two layers have an inverted T-shaped section.

Next, with the use of the conductive layer 207a and the sidewall 210 as a mask, the semiconductor layer 203 is doped with a higher concentration of n-type impurity. As the n-type impurity, phosphorus, arsenic, and the like can be used. The semiconductor layer 203 is doped with the impurity through the insulating layer 204, and a higher-concentration impurity region 215 is thus formed in the semiconductor layer 203.

As described above, an n-channel TFT including the semiconductor layer 203, the insulating layer 204, and the conductive layers 207a and 207b is manufactured. As described above, a transistor that has an LDD structure in which the conductive layer 207a and the lower-concentration impurity region 214 are overlapped with each other can be manufactured. In addition, only n-channel transistors may be formed as in the present embodiment mode, or a region and another region may be doped respectively with a p-type impurity and an n-type impurity with the use of masks as in Embodiment Mode 1 to manufacture both a p-channel transistor and an n-channel transistor.

Next, an insulating layer 212 is formed to cover the conductive layers 207a and 207b. The insulating layer 212 serves as an interlayer insulating layer, and may be formed in the same manner as the insulating layer 112 described in Embodiment Mode 1. In addition, a heat treatment or hydrogen treatment for activating the added impurities in the same way as described in Embodiment Mode 1.

Next, contact holes are formed to reach the semiconductor layer 203 through the insulating layer 212. Then, after forming a conductive layer to cover the insulating layer 212 with the contact holes, the conductive layer is processed in a desired shape to form a wiring 213 for transmitting a signal to a transistor.

It is to be noted that a semiconductor device including a multilayer wiring may be manufactured by providing an insulating film on the wiring 213 and further forming another wiring on the insulating layer.

By manufacturing a semiconductor device as described above, defects due to a reaction product generated in dry etching for forming a conductive layer can be prevented from occurring, and a semiconductor device that operates well can be obtained. In addition, it is not necessary to prepare any new apparatus, and the method for manufacturing a semiconductor device according to the present invention can be implemented with the use of existing apparatuses.

(Embodiment Mode 3)

By using a method for manufacturing a semiconductor device according to the present invention, integrated circuits can be manufactured with a higher yield. In the present embodiment mode, a central processing unit (CPU) manufactured according to the present invention will be described with reference to FIG. 5A.

Figure 5A:
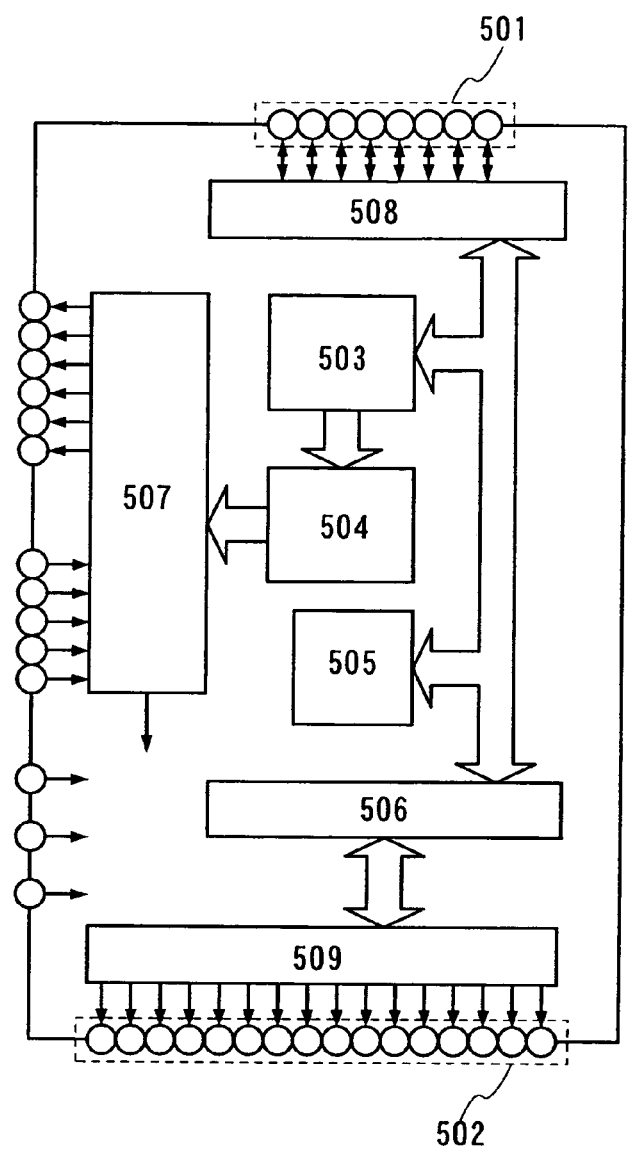
FIGS. 5A and 5B are a block diagram of a central processing unit manufactured according to the present invention and a diagram of an electronic device in which the central processing unit is mounted.

FIG. 5A is a block diagram of a central processing unit. In FIG. 5A, reference numeral 501 denotes a data bus, which has a function of inputting and outputting an instruction, a calculation, or a value to be used for calculation. Reference numeral 502 denotes an address bus, which has a function of inputting and outputting the address of memory space or I/O space. Reference numeral 503 denotes an instruction register, which has a function of storing an instruction once. Reference numeral 504 denotes an instruction decoder, which has a function of analyzing an instruction. Reference numeral 505 denotes an ALU, which has a function of performing arithmetic operations and logical operations. Reference numeral 506 denotes a register array, which is a memory to be used in the CPU. Reference numeral 507 denotes a CPU timing controller, which has a function of generating each control signal in accordance with a signal from the instruction decoder 504. Reference numeral 508 denotes a data bus interface, which has an interface function between a data bus inside the CPU and a data bus outside the CPU. Reference numeral 509 denotes an address buffer, which controls address output has a function as a buffer.

The circuits included in the central processing unit as shown in FIG. 5A are manufactured by a method for manufacturing a semiconductor device according to the present invention as described in Embodiment Mode 1 or 2. The block configuration of the central processing unit is not particularly limited, and may further have a block that has a function different from the functions described above.

Like the central processing unit in the present embodiment mode, a semiconductor device manufactured according to the present invention has fewer defects due to a residue of a reaction product that adheres in dry etching for forming a wiring, and provides favorable operating characteristics.

Figure 5B:
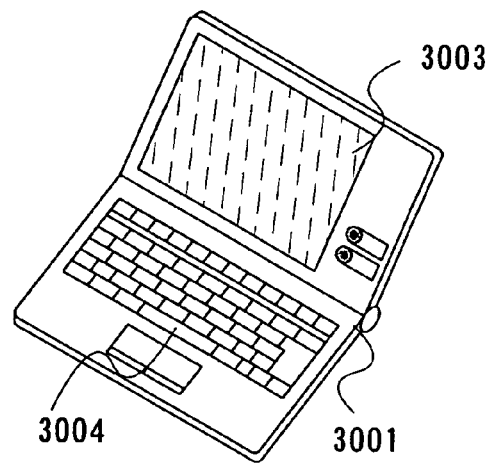

In addition, FIG. 5B is a diagram of a computer completed by mounting a semiconductor device manufactured according to the present invention. The configuration of the computer is not particularly limited, and the computer may have a configuration in which a display portion 3003, a main body 3001, and a keyboard 3004 are integrated as shown in FIG. 5B, or a configuration in which a display portion is separated from a main body. Inside the main body 3001, a calculation board including the central processing unit shown in FIG. 5A is provided. This makes it possible to obtain a computer that provides favorable operating characteristics without introducing errors in arithmetic processing.

In addition to the computer described above, a semiconductor device according to the present invention may be mounted in an electronic device such as a car navigation system or a personal digital assistance. This makes it possible to obtain an electronic device that provides favorable operating characteristics without introducing errors in arithmetic processing.

(Embodiment Mode 4)

An example of a method for manufacturing an integrated circuit film by using a method for manufacturing a semiconductor device according to the present invention will be described with reference to FIGS. 8A to 8D.

First, a peel-off layer 721 is formed on a substrate 701. Here, the substrate 701 is not particularly limited, and a flexible substrate including plastics or the like as a material can be used in addition to a substrate including glass or quartz as a material. In addition, the peel-off layer 721 is not particularly limited either, and can be formed with the use of silicon or the like.

Next, an insulating layer 722 is formed on the peel-off layer 721. The insulating layer 722 is not particularly limited, and can be formed with the use of silicon oxide, silicon nitride, silicon nitride including oxygen, or the like. In addition, the insulating layer 722 may be any one of a single layer and a multilayer.

Next, an element layer 723 is manufactured on the insulating layer 722 in the same way that the insulating layer 102 to the wiring 113 are manufactured in Embodiment Mode 1. It is to be noted that a circuit element such as a memory element or a capacitor may be further provided as an element in addition to a transistor. In addition, an element or the like may be formed in the same way that the insulating layer 202 to the wiring 213 are manufactured in Embodiment Mode 2.

Next, in order to expose a portion of the wiring 113 included in the element layer 723, an insulating layer 724 with an opening provided is formed to cover the element layer 723. It is to be noted that the same components as those shown in FIGS. 1A to 1G and FIGS. 2A to 2D are represented by the same reference numbers in FIGS. 8A to 8D.

Next, an opening is provided to reach the peel-off layer 721 through the element layer 723 and the insulating layer 724.

Next, a liquid or a gas is dispersed into the opening provided through the element layer 723 and the insulating layer 724 to etch the peel-off layer 721 selectively. The method for etching is not particularly limited, and for example, when the peel-off layer 721 is formed to include silicon, the peel-off layer 721 can be removed with the use of $ClF_3$ gas, a gas such as bromine trifluoride ($BrF_3$) or iodine fluoride (IF), or a liquid such as TMAH (tetramethyl ammonium hydroxide). In this way, the element layer 723 is separated from the substrate 701 by removing the peel-off layer 721.

Next, an insulating layer 742 with an antenna 741 provided is attached to the insulating layer 724 with the use of an anisotropic conductive adhesive material 743 including conductive particles 744. A portion of the antenna 741 is exposed at an opening provided for the insulating layer 742, and the wiring 113 exposed at the opening provided for the insulating layer 724 is electrically connected to the antenna 741 exposed at the opening provided for the insulating layer 742.

As described above, it is possible to manufacture an integrated circuit film in which various data can be written or from which various data can be read out. It is to be noted that a support such as a plastic film may be attached to the insulating layer 722.

Like the integrated circuit film in the present embodiment mode, a semiconductor device manufactured according to the present invention has fewer defects due to a residue of a reaction product that adheres in etching for forming a wiring, and provides favorable operating characteristics.

The above-described integrated circuit film manufactured according to the present invention is mounted in an article such as an identification card, and then is used for writing or reading in personal information such as a name, a blood type, height, weight, and an address. Further, in addition to identification cards, the integrated circuit film may be mounted in another articles, for example, in a packing container for food, and may be used for managing information such as the production district and producer of food, the production district of an ingredient, and, the date of manufacture.

As described above, an article that is capable of processing data in security without introducing errors can be obtained by mounting the integrated circuit film according to the present invention.

Embodiment 1

An experiment for examining an effect of the present invention will be described with reference to FIGS. 6A to 6E.

Figure 6A:
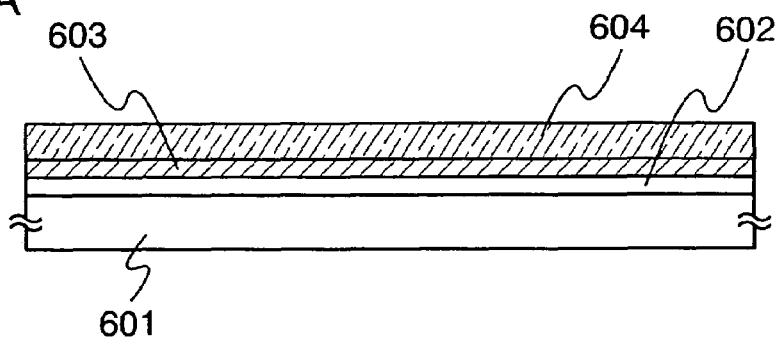
FIGS. 6A to 6E are diagrams illustrating an experiment for confirming an effect of the present invention.

For the experiment, as shown in FIG. 6A, a sample in which an insulating layer 602, a conductive layer 603, and a conductive layer 604 are in sequence stacked on a substrate 601 is used. Here, the substrate 601 comprises glass as a material. The insulating layer 602, which comprises silicon oxide, is formed by CVD to be 115 nm in thickness. In addition, the conductive layer 603, which comprises tantalum nitride, is formed by sputtering to be 30 nm in thickness. Further, the conductive layer 604, which comprises tungsten, is formed by sputtering to be 370 nm in thickness.

Figure 6B:
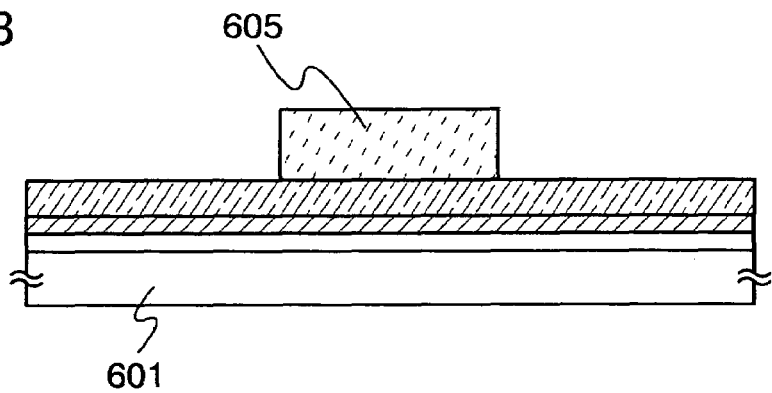
Figure 6C:
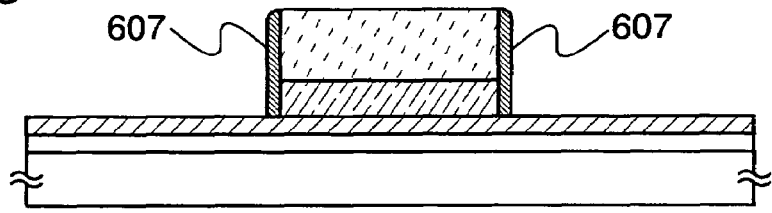

First, resist for i-line, which is formed by spin coating, is processed by photolithography to form a mask 605 composed of resist on the conductive layer 604 (FIG. 6B). The resist is formed by controlling the revolution speed and the like so that the film thickness of the resist is 1 μm. In addition, in photolithography, i-line (wavelength: 365 nm) is used as a light source. The formed mask 605 is a pattern referred to as a so-called "line and space" in which a plurality of linear patterns, 0.4 to 1.0 μm on a side is arranged. In addition, the formed mask 605 has a taper angle (angle formed by the surface of the conductive layer 604 and a side wall of the mask 605 composed of the resist) of 80 to 90 degrees.

Next, the conductive layer 604 is selectively etched with the use of an ICP dry etching system. As a process gas, a mixed gas of chlorine ($Cl_2$) gas, carbon tetrafluoride ($CF_4$) gas, and oxygen ($O_2$) gas is used. Then, the gas flow rates of the chlorine gas, the carbon tetrafluoride gas, and the oxygen gas are regulated respectively to be 50 sccm, 50 sccm, and 20 sccm, and the mixed gas is supplied into a chamber for processing. In addition, the pressure in the chamber is controlled to be kept at 1.5 Pa. In addition, power regulation is performed so that the power of ICP and the bias power of a lower electrode side are respectively 500 W and 20 W. The temperature of the lower electrode is controlled to be 70° C. (a set value before staring etching). It is to be noted that etching is applied with the substrate 601 located on the lower electrode until an etching end can be detected by change in plasma emission intensity when plasma emission intensity is observed. In the present embodiment, emission intensity with a wavelength of 777 nm is observed.

By dry etching of the conductive layer 604 under the conditions described above, a reaction product 607 generated during the process adheres to a side wall of the mask 605 composed of the resist and a side wall of the conductive layer 604 remaining after etching. Here, the adhesion of the reaction product 607 to the side wall of the conductive layer 604 makes it possible to the side wall of the conductive layer 604 from being etched into a concaved shape.

Figure 6D:
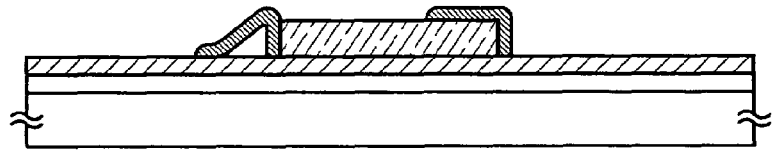
Figure 6E:
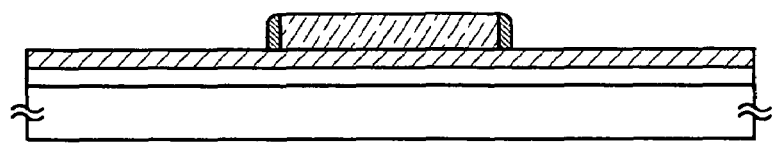
Figure 7A:
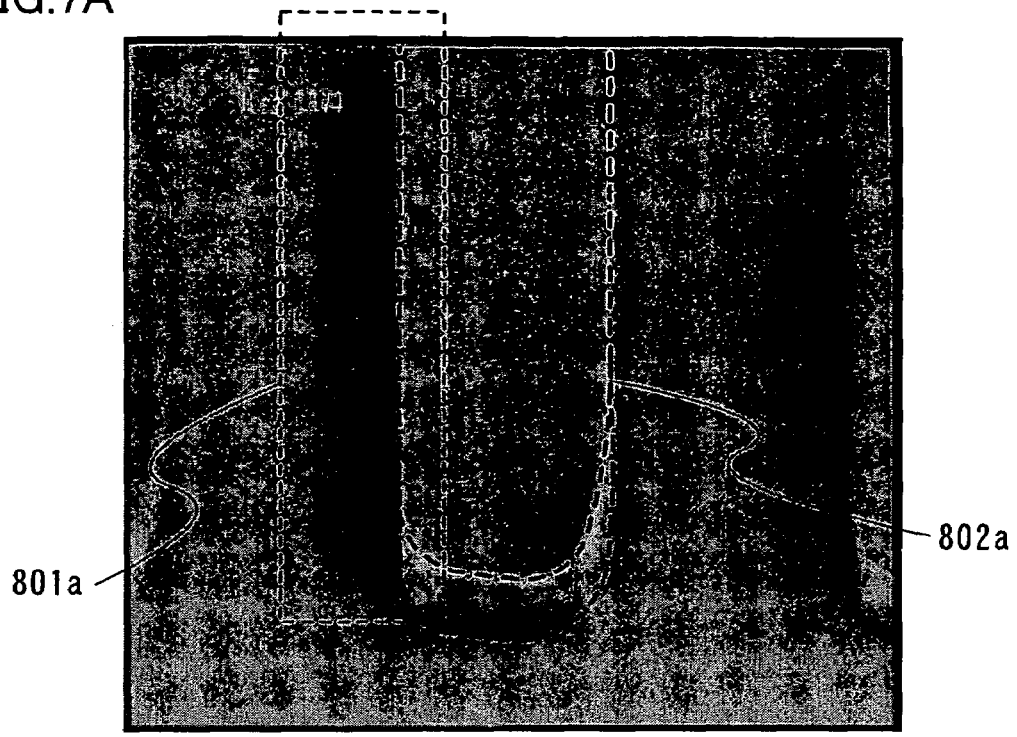
FIGS. 7A and 7B are diagrams of SEM images taken in the experiment for confirming an effect of the present invention.

Next, a reactive ion etching (RIE) dry etching system is used to perform ashing of the sample. As a process gas, oxygen gas is used, and regulated to be supplied into a chamber for processing at a flow rate of 100 sccm. In addition, the pressure in the chamber is regulated to be kept at 66.5 Pa. Further, the bias power of a lower electrode side is regulated to be 200 W. Under the conditions described above, ashing is performed for 30 seconds. Next, a stripping solution (N300 from Nagase & Co., Ltd.) is used to process the sample. Then, after the process with the used of the stripping solution, the stripping solution is removed by batch washing. This process removes most of the mask 605 composed of the resist and reaction product 607. However, as shown in FIG. 6D, a portion of the reaction product 607 is made to fall down on the conductive layer 603 or the conductive layer 604, and remains adhering to the conductive layer 603 or the conductive layer 604. FIG. 7A is a diagram of a SEM image of a linear pattern 1 μm in width (designed length) of the sample processed as described above, which is taken at 40,000-fold magnification by a critical dimension scanning electron microscope (Model Number: S-7800M from Hitachi, Ltd.). In FIG. 7A, the outline of the linear pattern is indicated by a dashed line 802a. From FIG. 7A, it is determined that the reaction product (surrounded by a rectangle indicated by a dashed line 801a) appearing in black at the side of the conductive layer can be confirmed on the left-hand side of the linear pattern by the critical dimension scanning electron microscope. Further, a reaction product of another sample manufactured by conducting the same process as described above is specified by a transmission electron microscope (TEM), and elements included in the reaction product is identified by energy disperse X-ray spectroscopy (EDX). In the result, it is determined that metal elements such as tungsten, tantalum, and aluminum are included.

Next, an inductively coupled plasma (ICP) dry etching system is used to process the sample and etch the reaction product 607 lying on the conductive layer 603 or the conductive layer 604. Here, a mixed gas of chlorine gas and oxygen gas is used as a process gas. Then, the gas flow rates of the chlorine gas and the oxygen gas are regulated respectively to be 5 sccm and 75 sccm, and the mixed gas is supplied into a chamber for processing. In addition, the pressure in the chamber is controlled to be kept at 1.9 Pa. In addition, power regulation is performed so that the power of ICP and the bias power of a lower electrode side are respectively 500 W and 100 W. By this process, an active species excited by plasma discharge and accelerated by applying the bias power travels in a direction perpendicular to the substrate surface of the sample. It is to be noted that the processing time is controlled to be 30 seconds.

Figure 7B:
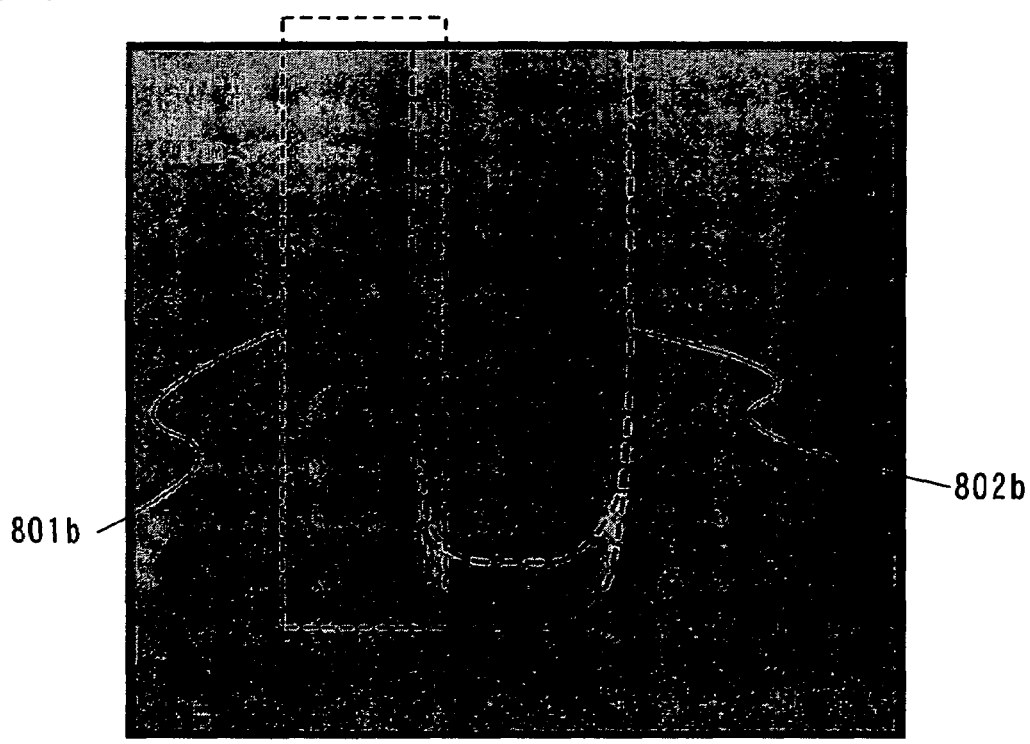
Figure 8A:
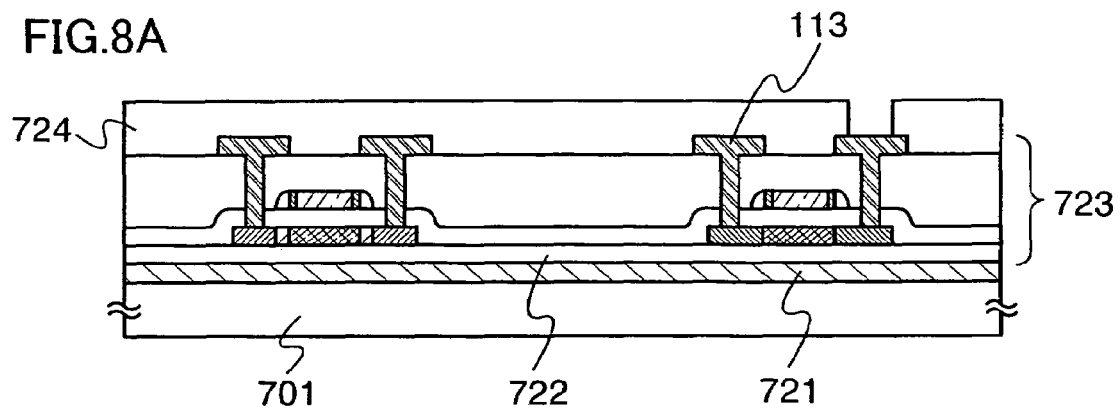
FIGS. 8A to 8D are diagrams illustrating a method for manufacturing an integrated circuit film according to the present invention.
Figure 8B:
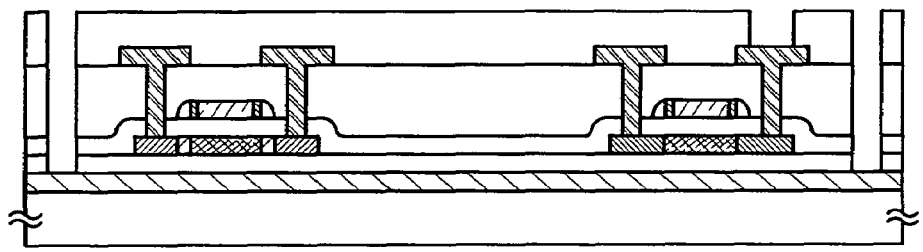
Figure 8C:
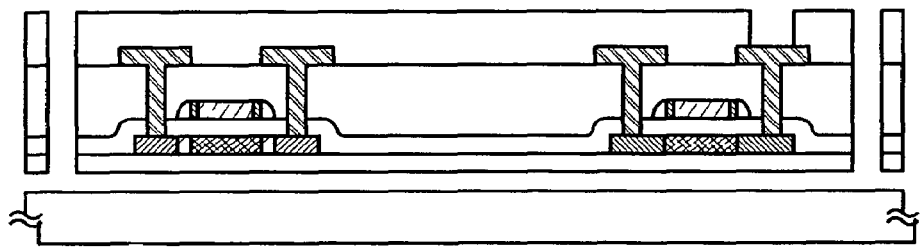
Figure 8D:
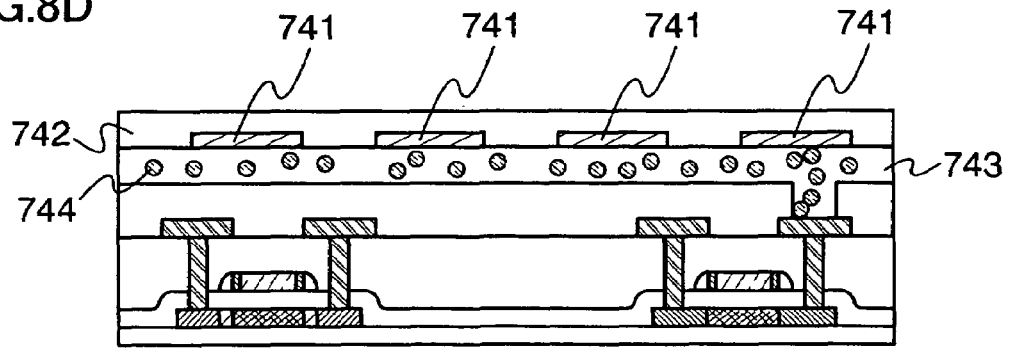

FIG. 7B shows a diagram of a SEM image of the sample after dry etching with the use of the mixed gas of chlorine gas and oxygen gas as the process gas, which is taken at 40,000-fold magnification by a critical dimension scanning electron microscope. It is to be noted that the same portion of the same sample is observed in the SEM image in FIG. 7A and the SEM image in FIG. 7B. In FIG. 7B, the outline of the linear pattern is indicated by a dashed line 802b. There is no reaction product in a region surrounded by a rectangle indicated by a dashed line 801b in FIG. 7B, which is appearing in the region surrounded by the rectangle indicated by the dashed line 801a in FIG. 7A. Accordingly, it is determined that the reaction product adhering to the conductive layer 603 or the conductive layer 604 can be removed. This is because the falling of the reaction product 607 makes the film thickness of the reaction product 607 thinner with respect to the direction in which the active species excited by plasma discharge is accelerated by the bias application so that etching is made easier.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for manufacturing a semiconductor device, comprising the steps of:
    forming a conductive layer over a substrate;
    forming a mask over the conductive layer;
    patterning the conductive layer by first etching with the mask wherein a reaction product is adhering to at least a side wall of the patterned conductive layer and a portion of the reaction product is adhering to a side wall of the mask;
    processing with the use of a liquid composition to remove the mask and fell the portion of the reaction product in a horizontal direction or an oblique direction with respect to the substrate; and
    removing at least the portion of the reaction product by second etching with oxygen gas and halide gas as a process gas.

2. The method according to claim 1, wherein the mask comprises a photosensitive resin.

3. The method according to claim 1, wherein the halide gas is chlorine gas.

4. The method according to claim 1, wherein the second etching is performed by inductively coupled plasma.

5. The method according to claim 1, wherein the reaction product which is adhering to the side wall of the patterned conductive layer is left after removing at least the portion of the reaction product by second etching.

6. The method according to claim 1, wherein a tip of the reaction product which is felled is in contact with a top surface of the patterned conductive layer.

7. A method for manufacturing a semiconductor device, comprising the steps of:
    forming a conductive layer over a substrate;
    forming a mask over the conductive layer;
    patterning the conductive layer by first etching with the mask wherein a reaction product is adhering to at least a side wall of the patterned conductive layer and a portion of the reaction product is adhering to a side wall of the mask;

subjecting the reaction product to a treatment with a liquid composition and a solution treatment while applying sound wave energy to fell the portion of the reaction product in a horizontal direction or an oblique direction with respect to the substrate; and removing at least the portion of the reaction product by second etching with oxygen gas and halide gas as a process gas.

8. The method according to claim 7, wherein the mask comprises a photosensitive resin.

9. The method according to claim 7, wherein the halide gas is chlorine gas.

10. The method according to claim 7, wherein the second etching is performed by inductively coupled plasma.

11. The method according to claim 7, wherein the reaction product which is adhering to the side wall of the patterned conductive layer is left after removing at least the portion of the reaction product by second etching.

12. The method according to claim 7, wherein a tip of the reaction product which is felled is in contact with a top surface of the patterned conductive layer.

13. A method for manufacturing a semiconductor device, comprising the steps of:

forming a conductive layer over a substrate;

forming a mask over the conductive layer;

patterning the conductive layer by first etching with the mask wherein a reaction product is adhering to at least a side wall of the patterned conductive layer and a portion of the reaction product is adhering to a side wall of the mask;

subjecting the reaction product to a treatment with a liquid composition and a solution treatment while applying ultrasonic waves or megasonic waves to fell the portion of the reaction product in a horizontal direction or an oblique direction with respect to the substrate; and removing at least the portion of the reaction product by second etching with oxygen gas and halide gas as a process gas.

14. The method according to claim 13, wherein the mask comprises a photosensitive resin.

15. The method according to claim 13, wherein the halide gas is chlorine gas.

16. The method according to claim 13, wherein the second etching is performed by inductively coupled plasma.

17. The method according to claim 13, wherein the reaction product which is adhering to the side wall of the patterned conductive layer is left after removing at least the portion of the reaction product by second etching.

18. The method according to claim 13, wherein a tip of the reaction product which is felled is in contact with a top surface of the patterned conductive layer.

19. A method for manufacturing a semiconductor device, comprising the steps of:

forming a semiconductor layer over a substrate;

forming an insulating layer over the semiconductor layer;

forming a conductive layer over the insulating layer;

forming a mask over the conductive layer;

patterning the conductive layer by first etching with the mask wherein a reaction product is adhering to at least a side wall of the patterned conductive layer and a portion of the reaction product is adhering to a side wall of the mask;

processing with the use of a liquid composition to remove the mask and fell the portion of the reaction product in a horizontal direction or an oblique direction with respect to the substrate;

removing at least the portion of the reaction product by second etching with oxygen gas and halide gas as a process gas; and forming an impurity region in the semiconductor layer by using the patterned conductive layer as a mask.

20. The method according to claim 19, wherein the mask comprises a photosensitive resin.

21. The method according to claim 19, wherein the halide gas is chlorine gas.

22. The method according to claim 19, wherein the second etching is performed by inductively coupled plasma.

23. The method according to claim 19, wherein the reaction product which is adhering to the side wall of the patterned conductive layer is left after removing at least the portion of the reaction product by second etching.

24. The method according to claim 19, wherein a tip of the reaction product which is felled is in contact with a top surface of the patterned conductive layer.

25. The method according to claim 19, wherein a tip of the reaction product which is felled is in contact with the insulating layer.

26. A method for manufacturing a semiconductor device, comprising the steps of:

forming a semiconductor layer over a substrate;

forming an insulating layer over the semiconductor layer;

forming a conductive layer over the insulating layer;

forming a mask over the conductive layer;

patterning the conductive layer by first etching with the mask wherein a reaction product is adhering to at least a side wall of the patterned conductive layer and a portion of the reaction product is adhering to a side wall of the mask;

subjecting the reaction product to a treatment with a liquid composition and a solution treatment while applying sound wave energy to fell the portion of the reaction product in a horizontal direction or an oblique direction with respect to the substrate;

removing at least the portion of the reaction product by second etching with oxygen gas and halide gas as a process gas; and forming an impurity region in the semiconductor layer by using the patterned conductive layer as a mask.

27. The method according to claim 26, wherein the mask comprises a photosensitive resin.

28. The method according to claim 26, wherein the halide gas is chlorine gas.

29. The method according to claim 26, wherein the second etching is performed by inductively coupled plasma.

30. The method according to claim 26, wherein the reaction product which is adhering to the side wall of the patterned conductive layer is left after removing at least the portion of the reaction product by second etching.

31. The method according to claim 26, wherein a tip of the reaction product which is felled is in contact with a top surface of the patterned conductive layer.

32. The method according to claim 26, wherein a tip of the reaction product which is felled is in contact with the insulating layer.

33. A method for manufacturing a semiconductor device, comprising the steps of:

forming a semiconductor layer over a substrate;

forming an insulating layer over the semiconductor layer;

forming a conductive layer over the insulating layer;

forming a mask over the conductive layer;

patterning the conductive layer by first etching with the mask wherein a reaction product is adhering to at least a side wall of the patterned conductive layer and a portion of the reaction product is adhering to a side wall of the mask;

subjecting the reaction product to a treatment with a liquid composition and a solution treatment while applying ultrasonic waves or megasonic waves to fell the portion of the reaction product in a horizontal direction or an oblique direction with respect to the substrate;

removing at least the portion of the reaction product by second etching with oxygen gas and halide gas as a process gas; and forming an impurity region in the semiconductor layer by using the patterned conductive layer as a mask.

34. The method according to claim 33, wherein the mask comprises a photosensitive resin.

35. The method according to claim 33, wherein the halide gas is chlorine gas.

36. The method according to claim 33, wherein the second etching is performed by inductively coupled plasma.

37. The method according to claim 33, wherein the reaction product which is adhering to the side wall of the patterned conductive layer is left after removing at least the portion of the reaction product by second etching.

38. The method according to claim 33, wherein a tip of the reaction product which is felled is in contact with a top surface of the patterned conductive layer.

39. The method according to claim 33, wherein a tip of the reaction product which is felled is in contact with the insulating layer.

* * * * *